(12) United States Patent
Zhu et al.

(10) Patent No.: US 11,189,683 B2
(45) Date of Patent: Nov. 30, 2021

(54) ARRAY SUBSTRATE, DISPLAY PANEL AND MANUFACTURING METHOD FOR ARRAY SUBSTRATE

(71) Applicant: KUNSHAN GO-VISIONOX OPTO-ELECTRONICS CO., LTD, Kunshan (CN)

(72) Inventors: Yangjie Zhu, Kunshan (CN); Haifeng Lu, Kunshan (CN)

(73) Assignee: KUNSHAN GO-VISIONOX OPTO-ELECTRONICS CO., LTD, Kunshan (CN)

( * ) Notice: Subject to any disclaimer, the term of this patent is extended or adjusted under 35 U.S.C. 154(b) by 0 days.

(21) Appl. No.: 16/885,738

(22) Filed: May 28, 2020

(65) Prior Publication Data

US 2020/0295115 A1 Sep. 17, 2020

Related U.S. Application Data

(63) Continuation of application No. PCT/CN2019/074027, filed on Jan. 30, 2019.

(30) Foreign Application Priority Data

Sep. 14, 2018 (CN) .......................... 201811075874.8

(51) Int. Cl.
*H01L 27/32* (2006.01)
*H01L 51/00* (2006.01)
*H01L 51/56* (2006.01)

(52) U.S. Cl.
CPC ...... *H01L 27/3276* (2013.01); *H01L 51/0097* (2013.01); *H01L 51/56* (2013.01); *H01L 2227/323* (2013.01); *H01L 2251/303* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 9,893,094 B2 | 2/2018 | Kimura | |
| 9,954,110 B2 | 4/2018 | Koyama | |
| 2014/0209877 A1* | 7/2014 | Lee | H01L 29/78603 257/40 |

(Continued)

FOREIGN PATENT DOCUMENTS

| | | |
|---|---|---|
| CN | 104241544 A | 12/2014 |
| CN | 106449695 A | 2/2017 |

(Continued)

OTHER PUBLICATIONS

Machine translation of WO 2019/184319 (Year: 2019).*

(Continued)

*Primary Examiner* — J. E. Schoenholtz
(74) *Attorney, Agent, or Firm* — Maier & Maier, PLLC

(57) ABSTRACT

An array substrate, a display panel and a manufacturing method for the array substrate. An array substrate includes: a flexible substrate having a display area and a bending area; a barrier layer continuously laid on the flexible substrate, where a thickness of the barrier layer above the bending area is less than half of a thickness of the barrier layer above the display area; and a wiring layer laid directly above the barrier layer located in the bending area.

16 Claims, 5 Drawing Sheets

(56) References Cited

U.S. PATENT DOCUMENTS

2018/0138215 A1    5/2018  Kimura
2020/0295115 A1*   9/2020  Zhu ......................... H01L 51/56

FOREIGN PATENT DOCUMENTS

| | | | |
|---|---|---|---|
| CN | 106653820 A | 5/2017 | |
| CN | 106784377 A | 5/2017 | |
| CN | 107425016 A | 12/2017 | |
| CN | 108022942 A | 5/2018 | |
| CN | 108054188 A | 5/2018 | |
| CN | 108336099 A | 7/2018 | |
| CN | 108461648 A | 8/2018 | |
| CN | 108511493 A | 9/2018 | |
| JP | 2018-125541 A | 8/2018 | |
| TW | 201807461 A | 3/2018 | |
| TW | 201820603 A | 6/2018 | |
| WO | WO-2019184319 A1 * | 10/2019 | ......... H01L 27/3276 |

OTHER PUBLICATIONS

International Search Report dated May 24, 2019 in corresponding International application No. PCT/CN2019/074027; 4 pages.
Chinese Office Action dated Aug. 23, 2019 in corresponding Chinese application No. 201811075874.8; 5 pages.
Taiwanese Office Action dated Jul. 8, 2019 in corresponding Taiwanese application No. 108103951; 7 pages.

* cited by examiner

ARRAY SUBSTRATE, DISPLAY PANEL AND MANUFACTURING METHOD FOR ARRAY SUBSTRATE

CROSS-REFERENCE TO RELATED APPLICATIONS

This application is a continuation of International Application No. PCT/CN2019/074027, filed on Jan. 30, 2019, which claims the priority benefit of China Patent Application No. 201811075874.8, filed on Sep. 14, 2018. The contents of the above identified applications are incorporated herein by reference in their entireties.

FIELD

The present disclosure relates to the field of flexible display technologies, and particularly, to an array substrate, a display panel, and a manufacturing method for an array substrate.

BACKGROUND

Active Matrix Organic Light-Emitting Diode (AMOLED) is a self-luminous display device that is widely used in the flexible display technology because of its own thin film characteristics.

Generally, in order to enable a flexible display panel to have a bending function, the flexible display panel may be divided into a bending area and a display area according to a preset layout so as to realize a bending function and a display function thereof, respectively. FIG. 1 is a schematic structural diagram of an array substrate in a bending area in an existing flexible display panel. As shown in FIG. 1, the array substrate includes a flexible substrate 110, a barrier layer 120, and a metal wiring layer 140 that are sequentially laminated in the bending area, where a side of the barrier layer 120 facing away from the flexible substrate 110 has a plurality of convex structures 130; the metal wiring layer 140 includes at least two metal lines 141 that climb and extend with the convex structures 130. In the existing solution, the arrangement of the convex structures 130 in the barrier layer 120 is used to expand the ductility of the array substrate, thereby realizing the local bending function of the flexible display panel.

SUMMARY

An object of the present disclosure is to provide an array substrate, a display panel, and a manufacturing method for the array substrate, so as to optimize a bending effect of a flexible display panel.

In order to achieve the above purpose, the present disclosure provides the following technical solutions.

In an aspect, an embodiment of the present disclosure provides an array substrate, including: a flexible substrate having a display area and a bending area; a barrier layer continuously laid on the flexible substrate, where a thickness of the barrier layer above the bending area is less than half of a thickness of the barrier layer above the display area; and a wiring layer laid directly above the barrier layer located in the bending area.

In an optional embodiment, the thickness of the barrier layer above the bending area is less than a quarter of the thickness of the barrier layer above the display area. Where in an embodiment, the thickness of the barrier layer is less than or equal to 120 nm.

In an optional embodiment, the barrier layer above the bending area includes a plurality of strip-shaped depressions, and a convex structure is formed between two adjacent strip-shaped depressions; the wiring layer includes a plurality of signal transmission lines that are disposed at a top of the convex structure, and the strip-shaped depressions are disposed along an extending direction of the signal transmission lines.

In an optional embodiment, at least one strip-shaped depression of the strip-shaped depressions in the barrier layer above the bending area has a thickness of less than 30 nm.

In an optional embodiment, each of the strip-shaped depressions extends through the barrier layer to form a through groove, and the strip-shaped depressions are separated from each other.

In an optional embodiment, the barrier layer above the display area includes a first barrier layer and a second barrier layer stacked above the first barrier layer from a surface of the flexible substrate; a material of the second barrier layer is different from a material of the first barrier layer.

In an embodiment, the material of the first barrier layer is silicon nitride, and the material of the second barrier layer is silicon oxide.

In an embodiment, the material of the barrier layer above the bending area is the same as that of the first barrier layer.

In an optional embodiment, the barrier layer above the display area is a three-layer structure of silicon oxide-silicon nitride-silicon oxide.

In another aspect, an embodiment of the present disclosure provides a display panel including the array substrate of any one described above.

In an optional embodiment, the array substrate includes a display area and a bending area, and the bending area is located outside a short side of the display area. Where in an embodiment, the bending area is bent to a back surface of the display area.

In an optional embodiment, the array substrate includes at least two display areas and at least one bending area, and the bending area is located between two adjacent display areas.

In a final aspect, an embodiment of the present disclosure provides a manufacturing method for an array substrate, including: providing a flexible substrate having a display area and a bending area; laying a barrier layer continuously on the flexible substrate; at least partially removing the barrier layer above the bending area in the direction of thickness so that a thickness of the barrier layer above the bending area is less than half of a thickness of the barrier layer above the display area; and laying a metal film above the barrier layer located in the bending area, and patterning the metal film to form a wiring layer.

In an optional embodiment, the wiring layer includes a plurality of signal transmission lines; after the patterning the metal film to form a wiring layer, the method further includes: etching the barrier layer between adjacent signal transmission lines in the bending area so as to remove the barrier layer between adjacent signal transmission lines in the bending area.

In an optional embodiment, the barrier layer includes: a first barrier layer and a second barrier layer that are sequentially stacked; where a material of the first barrier layer is different from that of the second barrier layer; the step of at least partially removing the barrier layer above the bending area in the direction of thickness such that the thickness of the barrier layer above the bending area being less than half of the thickness of the barrier layer above the display area includes: removing the second barrier layer located in the bending area.

In an optional embodiment, the patterning the metal film to form a wiring layer includes: etching, using an etching process, the metal film and the first barrier layer that are located in the bending area, so that a pattern that includes a plurality of signal transmission lines is formed in the metal film, and a thickness of the first barrier layer after etching is less than or equal to 30 nm.

In the array substrate, the display panel, and the manufacturing method for the array substrate provided by the present disclosure, by making the thickness of the barrier layer above the bending area in the array substrate be less than half of that of the barrier layer above the display area, the barrier layer under stress is improved in ductility to make it difficult for the barrier layer to break due to stress concentration in the barrier layer, thereby avoiding the breakage of the metal wiring layer in the bending area and improving the bending performance of the flexible display panel.

BRIEF DESCRIPTION OF THE DRAWINGS

The accompanying drawings herein are incorporated into the specification and form part of the specification, showing embodiments conforming to the present disclosure and being used together with the specification to explain the principle of the present disclosure.

Figure 1:
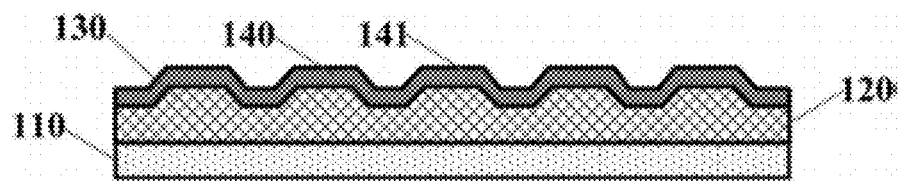
FIG. 1 is a schematic structural diagram of an array substrate in a bending area in an flexible display panel.

Clear embodiments of the present disclosure have been shown through the above drawings and will be described in detail below. These drawings and the written description are not intended to limit the scope of the concept of the present disclosure in any way, but rather to illustrate the concept of the present disclosure to those skilled in in the art by referring to specific embodiments.

REFERENCE NUMERALS

| 110- flexible substrate; | 120- barrier layer; | 130- convex structure |
| 140- metal wiring layer; | 141- metal line; | A- display area; |
| B- bending area; | 20- flexible substrate; | 21- barrier layer; |
| 22- wiring layer; | 221- metal line; | 23- convex structure; |
| 24- strip-shaped depression; | 25- through groove. | |

DESCRIPTION OF EMBODIMENTS

Exemplary embodiments, whose examples are shown in the drawings, of the present disclosure will be described in detail herein. When the following description involves the drawings, unless otherwise indicated, the same number in different drawings represents the same or similar elements. Embodiments described in the following exemplary embodiments do not represent all embodiments consistent with the present disclosure. Instead, they are merely examples of the apparatus and method consistent with some aspects of the present disclosure as detailed in the appended claims.

As described above, FIG. 1 is a schematic structural diagram of an array substrate in a bending area in a flexible display panel, and the barrier layer 120 between a flexible substrate 110 and a metal wiring layer 140 has a relatively large thickness. When bending occurs in the bending area of the array substrate, on the one hand, the barrier layer 120 having a larger thickness limits a bending angle of the bending area, and on the other hand, the stress generated during the bending process is concentrated on the barrier layer 120, and the barrier layer 120 with an excessive thickness cannot effectively disperse the stress so it itself is prone to break, which leads to a breakage of the metal wiring layer 140, affecting the bending performance of the flexible display panel.

In view of this phenomenon, embodiments of the present disclosure provide an array substrate, a display panel, and a manufacturing method for an array substrate. In the array substrate, a structure in which the thickness of the barrier layer above the bending area is less than half of the thickness of the barrier layer above the display area is used, thereby a film thickness between the wiring layer and the flexible substrate in the bending area is significantly reduced, and when bending occurs in the bending area of the array substrate, on the one hand, a bending angle of the array substrate is enlarged effectively, and on the other hand, the ductility of barrier layer under stress is also improved, making it difficult for the barrier layer to break due to stress concentration in the barrier layer, thereby avoiding the breakage of the wiring layer in the bending area and improving the bending performance of the flexible display panel.

The following is a detailed illustration of how the technical solutions of both the present disclosure and the present application solve the above technical problem with specific examples. The following specific embodiments may be combined with each other, and the same or similar concepts or processes may not be repeated in some embodiments. The embodiments of the present disclosure will be described below with reference to the accompanying drawings.

The flexible display panel according to the embodiments of the present disclosure may be applied to a display having only a display function, and may also be applied to a smart terminal device that provides an operation interactive function. The embodiments of the present disclosure do not give any limitation on the form in which the flexible display panel exists.

Figure 2:
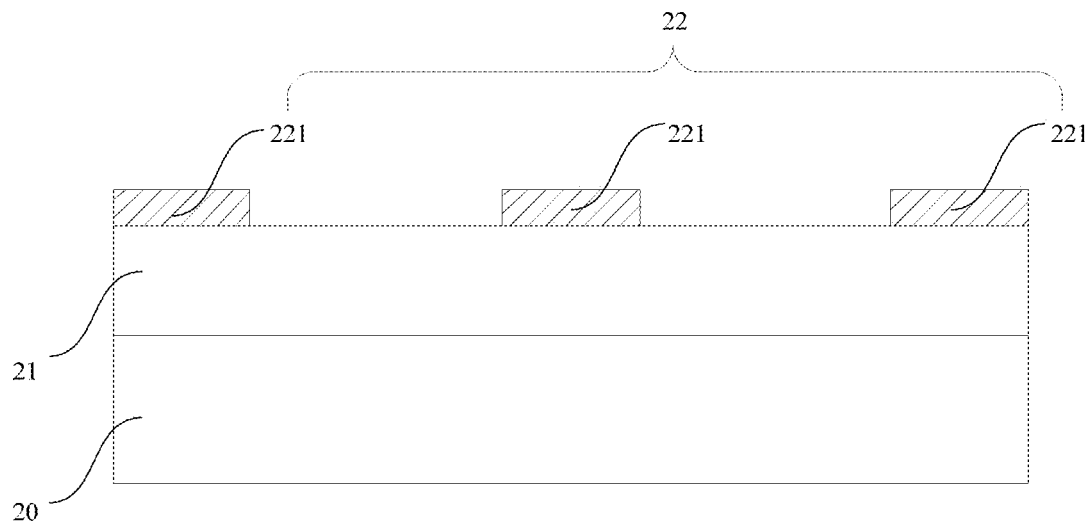
FIG. 2 is a side view of a structure of an array substrate according to Embodiment I of the present disclosure.
Figure 3:
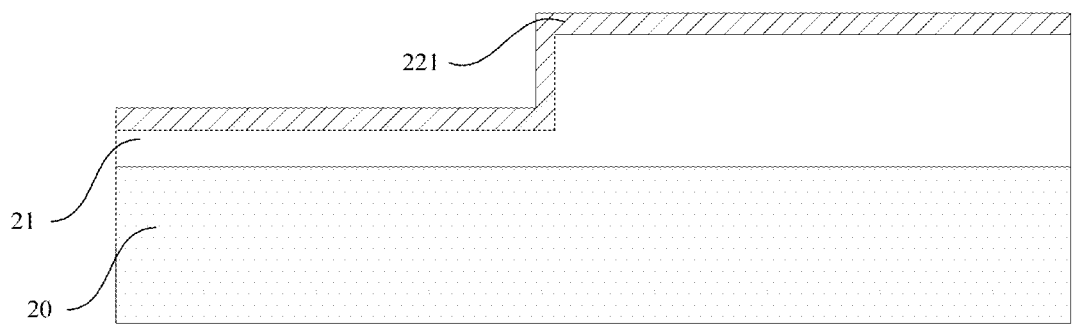
FIG. 3 is another side view of the structure of an array substrate according to Embodiment I of the present disclosure.
Figure 4:
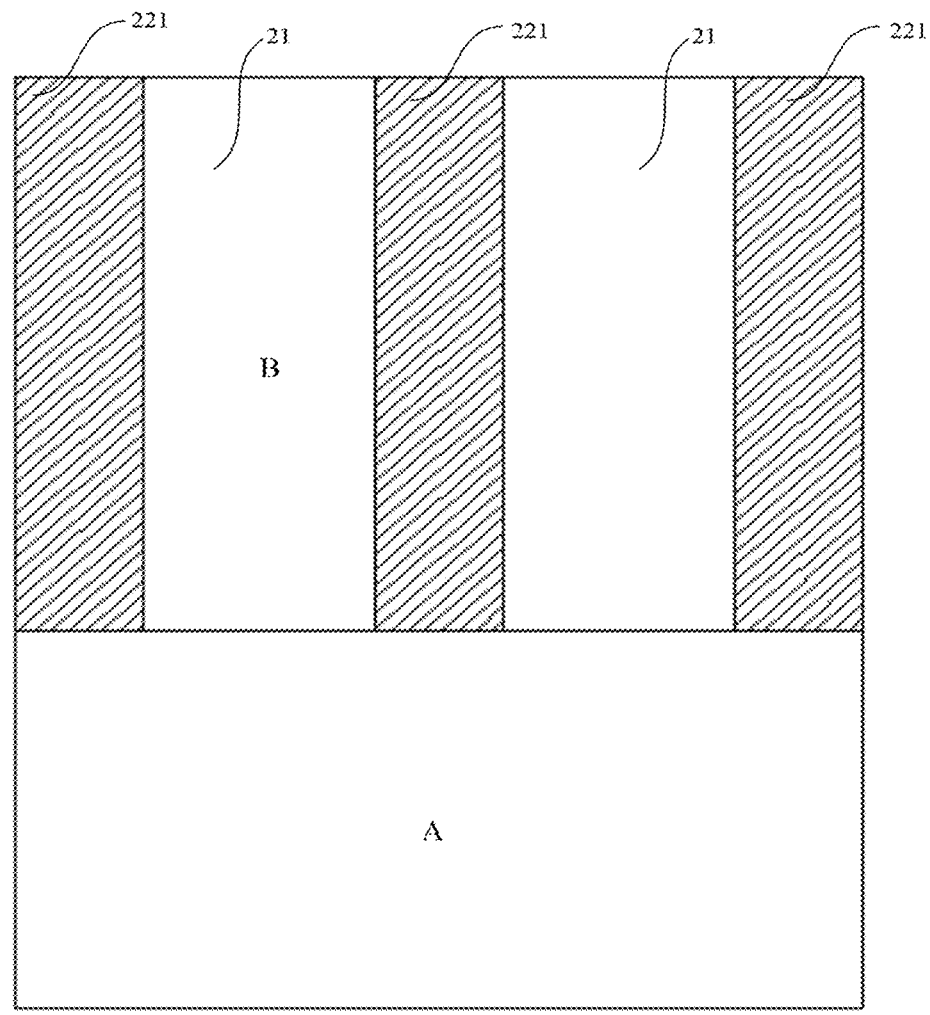
FIG. 4 is a top view of the structure of an array substrate according to Embodiment I of the present disclosure.

In order to solve the problem existing in the prior art that the wiring layer is prone to be broken during bending due to the large thickness of the film layer between the wiring layer and the flexible substrate, an embodiment of the present disclosure provides an array substrate. FIG. 2 is a side view of a structure of an array substrate according to Embodiment I of the present disclosure; FIG. 3 is another side view of a structure of an array substrate according to Embodiment I of the present disclosure; FIG. 4 is a top view of a structure of an array substrate according to Embodiment I of the present disclosure.

As shown in FIG. 2 to FIG. 4, the array substrate includes a flexible substrate 20, a barrier layer 21 and a wiring layer 22 disposed sequentially; where the flexible substrate 20 has a display area and a bending area; the barrier layer 21 is continuously laid on the flexible substrate 20, where a thickness of the barrier layer 21 above the bending area is less than half of that of the barrier layer 21 above the display area; the wiring layer 22 is directly laid above the barrier layer 21 in the bending area.

It may be understood by those skilled in the art that the array substrate includes a display area A and a bending area B, where the display area A corresponds to a display area of the display panel, and the bending area B corresponds to a bending area of the display panel. Correspondingly, in some embodiments of the present disclosure, the flexible substrate needs to be divided into the display area and the bending area according to a preset layout, and a material for displaying light emission, such as an organic light-emitting layer, in an AMOLED, and a thin film transistor structure for providing an electrical function for the organic light-emitting layer may be grown in the display area; while a metal line may be disposed in the bending area to transmit an electrical signal for a corresponding film structure in the display area.

The bending area B can be disposed on one side of the display area A, and the array substrate adopting such a layout can be applied to a display panel with a curved edge, that is, an edge of the display panel corresponds to the bending area B of the array substrate, and a central display part of the flexible display panel corresponds to the display area A of the array substrate. The bending area B can also be spaced apart from the display area A, for example, the display area A is disposed on both sides of the bending area B. The array substrate adopting such a layout can be applied to a display panel with a dual screen folding function or even to a display panel with a full screen curling function, that is, the display panel is bent through bending area B disposed at intervals so that the entire display panel is bent. It should be noted that the embodiments of the present disclosure do not limit the layout of both the display area A and the bending area B, or the form of the display panel on which the array substrate is based.

In an embodiment, the barrier layer 21 is continuously laid on the flexible substrate 20, where the thickness of the barrier layer 21 above the bending area is less than half of the thickness of the barrier layer 21 above the display area. In general, the barrier layer 21 on an existing flexible substrate is made of silicon oxide and has a thickness of typically 500-1000 nanometers (nm), such as about 600 nm; in some embodiments of the present disclosure, the thickness of the barrier layer 21 above the bending area is less than half of the thickness of the barrier layer 21 above the display area. On a side of the barrier layer 21 facing away from the flexible substrate 20, a wiring layer 22 including a plurality of metal lines 221 is laid. Where each of the metal lines 221 generally has an extending direction parallel to a row direction or a column direction of pixel units arranged in an array.

By using such a structure that the thickness of the barrier layer above the bending area in the array substrate be less than half of the thickness of the barrier layer above the display area so that the film thickness between the wiring layer and the flexible substrate in the bending area is significantly reduced, when the bending area of the array substrate is bent, the ductility of the barrier layer under stress is improved, making it difficult for the barrier layer to break due to stress concentration in the barrier layer, thereby avoiding the breakage of the metal wiring layer in the bending area and improving the bending performance of the flexible display panel.

In some embodiments of the present disclosure, the barrier layer 21 specifically employs one or more of silicon nitride, amorphous silicon or silicon oxide, depending on the manufacturing process.

In an embodiment, the thickness of the barrier layer 21 above the bending area is less than a quarter of the thickness of the barrier layer 21 above the display area. In an example, the thickness of the barrier layer 21 is less than or equal to 120 nm, for example, 50-100 nm. By further reducing the thickness of the barrier layer 21 above the bending area, the maximum bending angle that can be obtained in the bending area can be effectively increased, and the bending performance of the bending area is further improved. Compared with an existing structure, the present disclosure may achieve a large angle bending in the bending area, even 180 degree bending.

In an embodiment, the barrier layer above the display area includes a first barrier layer and a second barrier layer that are stacked up one above another from a surface of the flexible substrate; where the first barrier layer has a material different from a material of the second barrier layer; the barrier layer above the bending area may be formed by etching. The material of the first barrier layer and the material of the second barrier layer are different, and peaks of the two barrier layers in a spectrum are also different; during etching, by monitoring changes of the peaks of the materials in the spectrum, an etch termination node can be quickly and accurately controlled, thus the thickness of the barrier layer above the bending area can be reasonably controlled. For example, silicon nitride can be used as the first barrier layer and silicon oxide can be used as the second barrier layer; in an embodiment, the thickness of the first barrier layer is 50-100 nm, and the thickness of the second barrier layer may be no less than 300 nm, so as to ensure that the display area is not eroded by an external element.

In addition, the barrier layer above the display area, which is made into a composite structure layer, in particular, one layer of which is silicon nitride layer, can effectively protect a light-emitting device or a light-emitting material layer in the display area from being eroded by water vapor or oxygen. In other embodiments, the barrier layer is not limited to a two-layer structure, and may also be a three-layer structure of silicon oxide-silicon nitride-silicon oxide.

In the embodiment of the present disclosure, the flexible substrate may be of a single layer structure or a composite layer structure. In a single layer structure, polyimide may be used, and in the composite layer structure, polyimide-barrier layer-polyimide structure may be used, where the barrier layer can be silicon nitride, amorphous silicon or silicon oxide.

The metal lines 221 in the wiring layer 22 in an embodiment of the present disclosure may adopt a linear structure with a through-hole structure, that is, on each metal lines 221, a through-hole structure having the same size is uniformly disposed along an extending direction of the each metal line 221, and an axial direction of a hole of the through hole structure is perpendicular to a plane in which the wiring layer 22 is located. By adopting such an arrangement, the influence of stress on the metal lines 221 in the wiring layer 22 is further reduced when bending occurs in the bending area, and the breakage of the metal lines 221 due to stress concentration on the wiring layer 22 is avoided.

It is known that the metal lines 221 provided in this embodiment are specifically a signal transmission line that can be used to provide an electrical signal or a digital signal for the display area of the display panel.

On basis of the structures shown in FIGS. 2 to 4, Embodiment II provides another array substrate.

Different from the Embodiment I, in Embodiment II, the barrier layer above the bending area in the array substrate includes a plurality of strip-shaped depressions, and a convex structure is formed between two adjacent strip-shaped depressions; the wiring layer includes a plurality of signal transmission lines that are disposed at a top of the convex structure, and the strip-shaped depressions are disposed along an extending direction of the signal transmission lines, and in such a structure, the strip-shaped depressions separate adjacent signal transmission lines.

In Embodiment II, the barrier layer above the bending area is provided as an uneven structure composed of a plurality of strip-shaped depressions and a convex structure formed between two adjacent strip-shaped depressions, so that an average thickness of the barrier layer in the bending area is further reduced. It should be noted that the strip-shaped depressions may be formed synchronously in the process of molding the metal lines, or may be formed by an additional process after molding of the metal lines.

Figure 5:
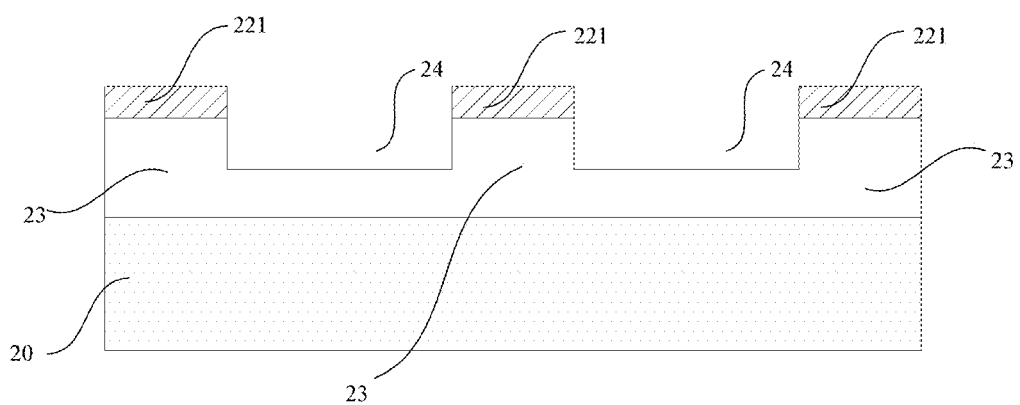
FIG. 5 is a schematic structural diagram of an array substrate according to Embodiment II of the present disclosure, in which the barrier layer above the bending area in the array substrate includes a plurality of strip-shaped depressions, and a convex structure is formed between two adjacent strip-shaped depressions.

Specifically, FIG. 5 is a schematic structural diagram of an array substrate according to Embodiment II of the present disclosure. As shown in FIG. 5, in the array substrate, the thickness of the strip-shaped depressions 24 in the barrier layer 21 is less than 30 nm.

In an embodiment, the barrier layer 21 above the bending area is provided as an uneven structure composed of a plurality of strip-shaped depressions 24 and a convex structure 23 formed between two adjacent strip-shaped depressions 24, which is beneficial to optimize the ductility of this part of the barrier layer 21 and facilitates evacuation of bending stress.

Figure 6:
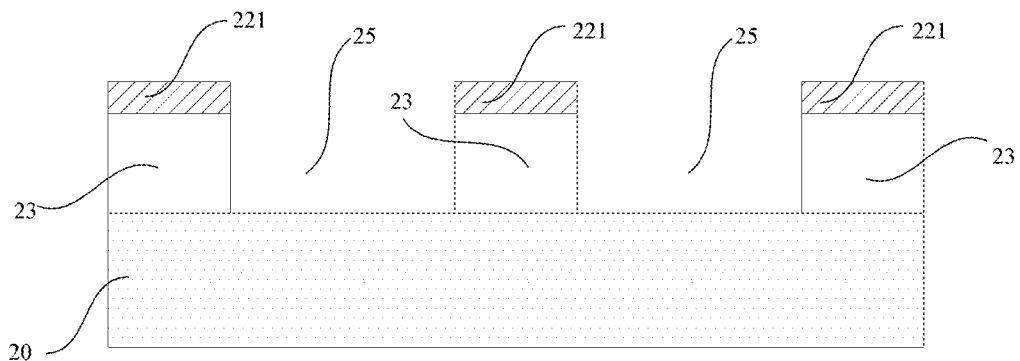
FIG. 6 is a schematic structural diagram of another array substrate according to Embodiment II of the present disclosure, in which the strip-shaped depressions are through grooves penetrating the barrier layer.

Specifically, FIG. 6 is a schematic structural diagram of another array substrate according to Embodiment II of the present disclosure. As shown in FIG. 6, in the array substrate, the strip-shaped depressions 24 are through grooves 25 penetrating the barrier layer 21, the strip-shaped depressions 24 are relatively separated, and correspondingly, convex structures 23 are relatively separated. Different from the foregoing embodiments, in the structure shown in FIG. 6, the barrier layer 21 specifically employs relatively separated convex structures 23, and correspondingly, the metal lines 221 on the wiring layer 22 may be respectively disposed at the top of each convex structure 23. In this embodiment, the flexible substrate 20 between adjacent strip-shaped convex structures 23 will be exposed to contact with other film layers in the array substrate.

In an embodiment, each of the convex structures is isolated, and thus with respect to the foregoing embodiments and the prior art, once any convex structure breaks in a bending line direction, i.e., in an extending direction perpendicular to the strip-shaped convex, the breakage will not spread to other strip-shaped convex, thereby reducing the damage to other metal lines by the breakage and avoiding damage to the entire array substrate.

This embodiment adopts an arrangement of the barrier layer with a different structure, further improving the bending performance of the array substrate in the bending area and avoiding the breakage of the metal wiring layer.

The present disclosure also provides a display panel, which specifically includes the array substrate according to any one of the foregoing embodiments.

Where as described in the foregoing embodiment, the array substrate in the display panel includes a display area and a bending area, and the bending area is located outside a short side of the display area, and in an embodiment, the bending area is bent to the back surface of the display area. By adopting such an arrangement, the bending area of the display panel is bent along the short side, and the bending line is parallel to the short side. In this structure, bending the bending area to the back surface of the display area is beneficial to realize a full screen setting.

Furthermore, the display panel includes at least two display areas and at least one bending area, and the bending area is located between two adjacent display areas. Upon such an arrangement, the bending area of the display panel is bent along a boundary line between the bending area and the display area, i.e., the bending line being parallel to the boundary line, such that the display areas on both sides of the bending area become a full-screen display area that can be bent at 180 degrees.

Figure 7:
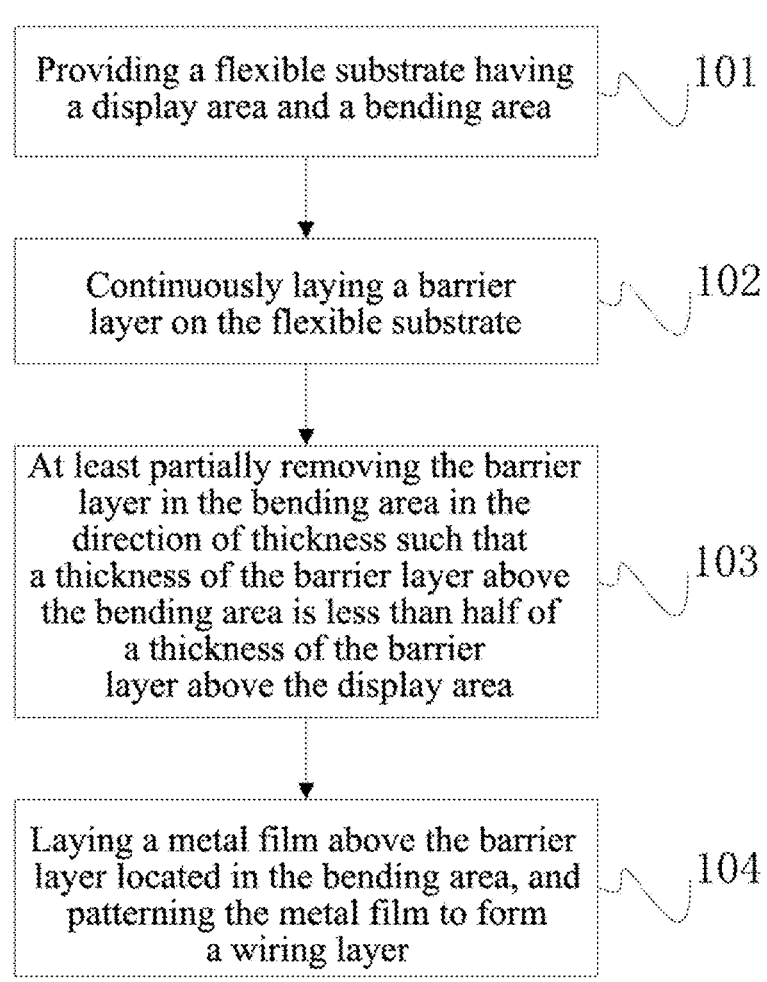
FIG. 7 is a schematic flow chart of a manufacturing method for an array substrate according to Embodiment III of the present disclosure.

In addition, the present disclosure also provides a manufacturing method for an array substrate, and FIG. 7 is a schematic flow chart of a manufacturing method for an array substrate according to Embodiment III of the present disclosure. As shown in FIG. 7, the method includes:

Step 101, providing a flexible substrate having a display area and a bending area;

Step 102, continuously laying a barrier layer on the flexible substrate;

Step 103, at least partially removing the barrier layer in the bending area in the direction of thickness, such that a thickness of the barrier layer above the bending area being less than half of a thickness of the barrier layer above the display area;

Step 104: laying a metal film above the barrier layer located in the bending area, and patterning the metal film to form a wiring layer.

Where the wiring layer may include a plurality of signal transmission lines, each of which is disposed perpendicular to a boundary line between the display area and the bending area.

By removing the barrier layer located in the bending area to make the thickness of the barrier layer above the bending area is less than half of the thickness of the barrier layer above the display area, the film layer between the wiring layer and the flexible substrate in the bending area has a significantly reduced thickness. In this way, when bending occurs in the bending area of the array substrate, on the one hand, a bending radius is increased effectively, and on the other hand, the ductility of the barrier layer under stress is improved, such that it is difficult for the barrier layer to break due to stress concentration in the barrier layer, thereby avoiding the breakage of the wiring layer in the bending area and improving the bending performance of the flexible display panel.

Figure 8:
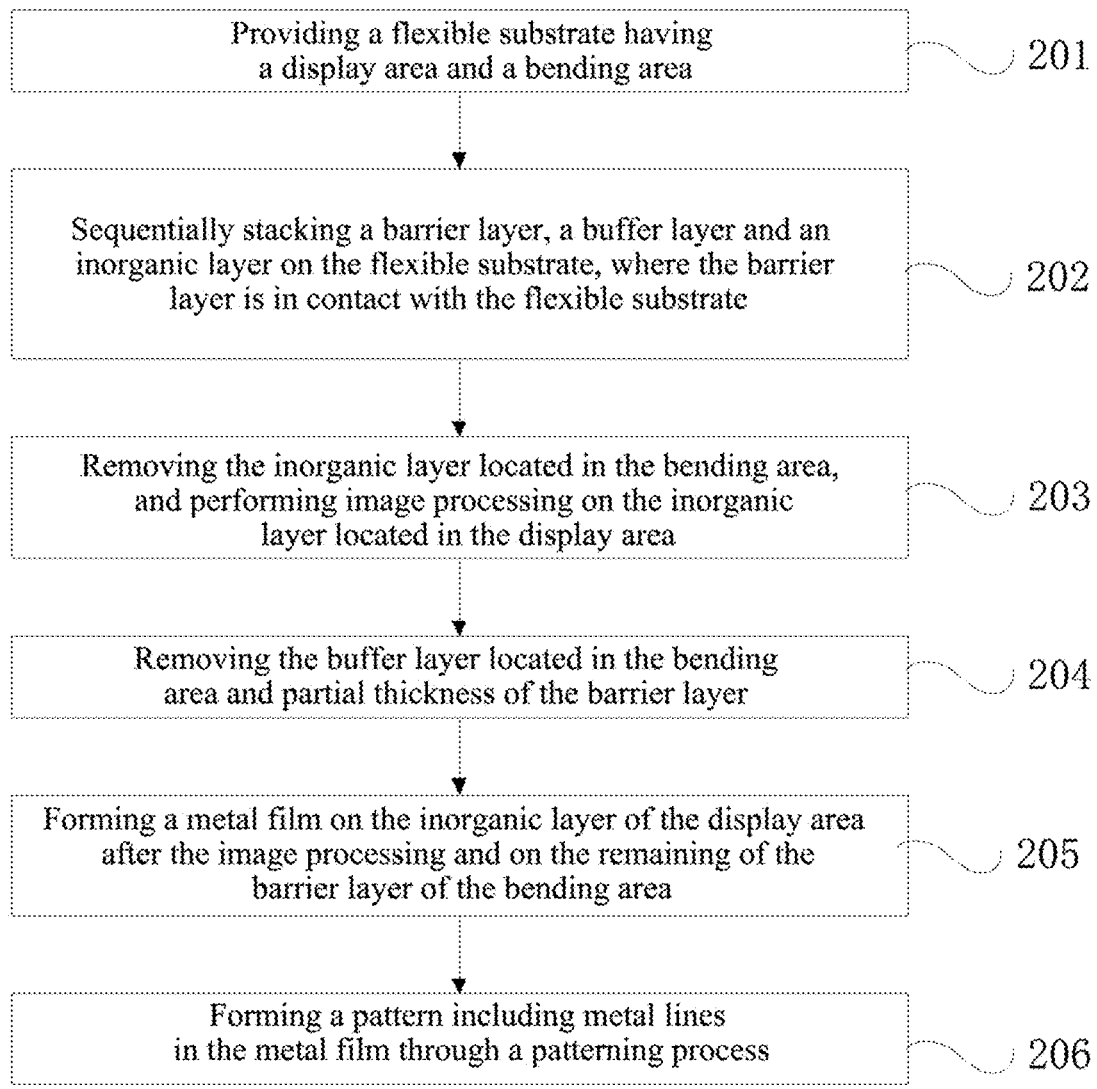
FIG. 8 is a schematic flow chart of a manufacturing method for an array substrate according to Embodiment IV of the present disclosure.

Specifically, for array substrates composed of different film layers, the present disclosure provides methods of manufacturing two specific array substrates:

in order to solve the problem in the prior art that the film layer between the wiring layer and the flexible substrate in the bending area has a large thickness, and the metal wire layer is easy to be broken when bending, the present disclosure provides a method of manufacturing an array substrate. FIG. 8 is a schematic flow chart of a manufacturing method for an array substrate according to Embodiment IV of the present disclosure. As shown in FIG. 8, the method includes:

Step 201, providing a flexible substrate having a display area and a bending area;

Step 202, sequentially stacking a barrier layer, a buffer layer and an inorganic layer on the flexible substrate, where the barrier layer is in contact with the flexible substrate;

Step 203, removing the inorganic layer located in the bending area, and performing an image processing on the inorganic layer located in the display area;

Step 204, removing the buffer layer located in the bending area and partial thickness of the barrier layer;

Step 205, forming a metal film on the inorganic layer of the display area after the image processing and on the remaining of the barrier layer of the bending area;

Step 206, forming a pattern including metal lines in the metal film through a patterning process.

Specifically, in the method of manufacturing the array substrate provided in Embodiment IV, a flexible substrate having a display area and a bending area is first provided, where the flexible substrate may use a polyimide substrate, or may use a substrate made of other material, such as polycarbonate.

In addition, the flexible substrate needs to be divided into a display area and a bending area according to a preset layout, a material for displaying light emission such as an organic light-emitting layer in the AMOLED can be grown in the display area, and a metal line can be disposed in the bending area to transmit an electrical signal to the display area. The bending area can be disposed on one side of the display area, and the array substrate adopting such layout can be applied to a display panel with a bent edge, that is, an edge of the display panel corresponds to the bending area of the array substrate, and a center display part of the flexible display panel corresponds to the display area of the array substrate. The bending area can also be spaced apart from the display area, for example, the display area is disposed on both sides of the bending area. The array substrate adopting such a layout can be applied to a display panel with a dual screen folding function or even to a display panel with a full screen curling function, that is, the display panel is bent through the bending area disposed at intervals so that the entire display panel is bent. It should be noted that the embodiments of the present disclosure do not limit the layout of both the display area and the bending area, or the form of the flexible display panel on which the array substrate is based.

A barrier layer, a buffer layer and an inorganic layer are sequentially laid on the flexible substrate, where the barrier layer is in contact with the flexible substrate, that is, the barrier layer is located at the bottom of the three layers and is in contact with the flexible substrate, and the inorganic layer is located at the top of the three layers and is away from the flexible substrate. The barrier layer may be made of silicon oxide and has a thickness of generally 600 nm; the inorganic layer includes a gate insulating layer, a capacitor insulating layer and an interlayer dielectric layer. A hierarchical structure of the inorganic layer varies depending on different product forms. The embodiments of the present disclosure do not limit this.

An etching process is used to remove the inorganic layer located in the bending area, while the inorganic layer located in the display area is imaged. Specifically, in step 203, the inorganic layer located in the bending area and the inorganic layer located in the display area need to be processed, where the inorganic layer of the bending area is etched to remove all of the inorganic layer in the bending area; an image processing is performed on the inorganic layer located in the display area to facilitate subsequent manufacture of an organic growth layer.

After step 203, in order to further reduce the film thickness between the wiring layer and the flexible substrate in the bending area, a manner of removing the buffer layer located in the bending area and removing partial thickness of the barrier layer is employed in step 204. Specifically, the thickness of the barrier layer is generally 600 nm. In an optional embodiment, the buffer layer and the partial thickness of the barrier layer that are located in the bending area can be removed by using an etching process, to remain the barrier layer with a certain thickness, where the thickness of the remained barrier layer needs to be less than half of the thickness of the barrier layer located in the display area. In an optional embodiment, the thickness of the remained barrier layer needs to be less than a quarter of the thickness of the barrier layer located in the display area. In an example, a remained thickness of the barrier layer may be less than 120 nm.

After step 204, a metal film is also formed on the inorganic layer of the display area after the image processing and on the remained barrier layer of the bending area through a metal film molding process. Finally, a pattern including metal lines is formed in the metal film through a patterning process, thereby completing the array substrate including pattern of the metal lines as shown in FIGS. 2 to 6.

In particular, as described in the structural embodiments, in order to further reduce the risk of metal line breakage in the bending area of the entire array substrate, after the pattern including the metal lines is formed in the metal film through the patterning process, the barrier layer between adjacent metal lines of the bending area can be etched, so as to remove the barrier layer between adjacent metal lines of the bending area, that is, the barrier layer is composed of a plurality of relatively separated strip-shaped depressions and a plurality of strip-shaped convexs. In this way, for the barrier layer located in the bending area, only the barrier layer under the metal lines is remained, and the barrier layer between the metal lines is removed, so that barrier layers remained in the bending area are spaced apart from each other and are no longer a whole. Once any strip-shaped convex breaks in a bending line direction, i.e., in an extending direction perpendicular to the strip-shaped convex, such breakage will not spread to the other strip-shaped convexs, thereby reducing the damage to other metal lines by the breakage and avoiding the damage to the entire array substrate.

Figure 9:
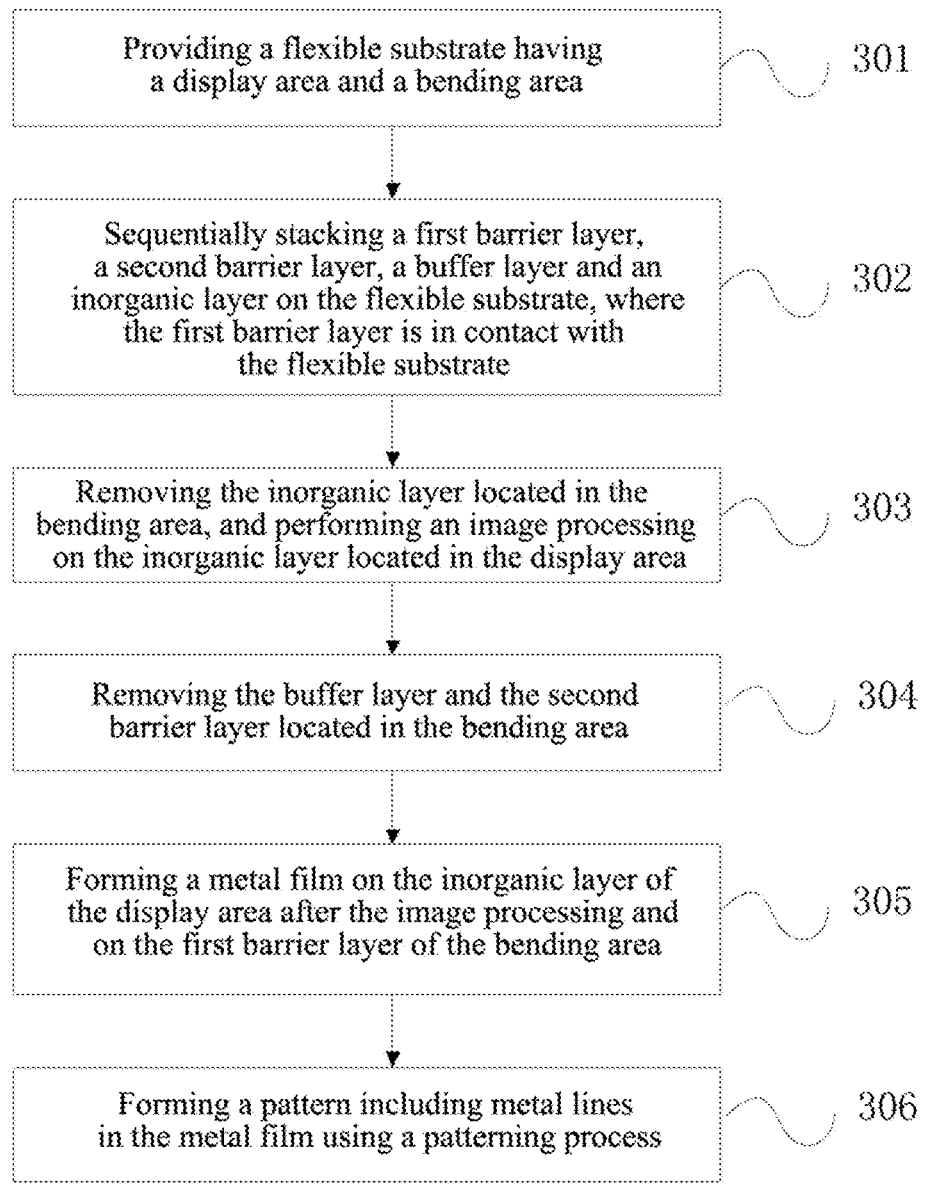
FIG. 9 is a schematic flow chart of another manufacturing method for another array substrate according to Embodiment IV of the present disclosure.

In addition, it should be noted that the barrier layer in the foregoing manufacturing method may be a single layer structure composed of a silicon oxide layer, or may be a composite structural layer composed of a silicon nitride layer and a silicon oxide layer, and the manufacturing method for the array substrate will be improved accordingly depending on a structural composition thereof. The following provides a manufacturing method for an array substrate when the barrier layer is composed of a composite structure layer. FIG. 9 is a schematic flow chart of a manufacturing method for another array substrate according to Embodiment IV of the present disclosure. As shown in FIG. 9, the manufacturing method includes:

Step 301, providing a flexible substrate having a display area and a bending area;

Step 302, sequentially stacking a first barrier layer, a second barrier layer, a buffer layer and an inorganic layer on the flexible substrate, where the first barrier layer is in contact with the flexible substrate;

Step 303, removing the inorganic layer located in the bending area, and performing an image processing on the inorganic layer located in the display area;

Step 304, removing the buffer layer and the second barrier layer located in the bending area;

Step 305, forming a metal film on the inorganic layer of the display area after the image processing and on the first barrier layer of the bending area;

Step 306, forming a pattern including metal lines in the metal film using a patterning process.

Specifically, in the manufacturing method for the array substrate, different from the foregoing method, a first barrier layer, a second barrier layer, a buffer layer and an inorganic layer are sequentially stacked on the flexible substrate. Where the first barrier layer is in contact with the flexible substrate, that is, the first barrier layer is located at the bottom of the four layers and is in contact with the flexible substrate, and the inorganic layer is located at the top of the four layers and is away from the flexible substrate.

Optionally, the first barrier layer is made of amorphous silicon. In an example, the first barrier layer is made of silicon nitride. In an embodiment, the first barrier layer formed in both the bending area and the display area on the flexible substrate has a thickness of less than 50 nm, and the second barrier layer in the bending has a thickness of greater than 300 nm.

In particular, during etching of the first barrier layer made of amorphous silicon or silicon nitride in step 306, when using amorphous silicon, especially silicon nitride material, due to that there is a certain rate difference between etching of the metal film and etching of the first barrier layer, the etching of the first barrier layer can be completed while the etching of the metal film is completed, and a precise etching technology can be used to detect the silicon element in an etching cavity, thereby avoiding etching to an organic layer of the flexible substrate and also avoiding a contamination of an etching chamber by the etching. The first barrier layer in the bending area after etching will have a thickness of less than or equal to 30 nm.

Finally, it should be noted that the above embodiments are merely illustrative of the technical solutions of the present disclosure, and are not to limit them; although the present disclosure has been described in detail with reference to the above embodiments, those skilled in the art will understand that they may still modify the technical solutions described in the above embodiments, or equivalently substitute some or all of the technical features therein; and these modifications or substitutions do not deviate the essence of the corresponding technical solutions from the scope of the technical solutions of the embodiments of the present disclosure.

What is claimed is:

1. An array substrate, comprising:
  a flexible substrate having a display area and a bending area;
  a barrier layer continuously laid on the flexible substrate, wherein a thickness of the barrier layer above the bending area is less than half of a thickness of the barrier layer above the display area; and
  a wiring layer laid directly above the barrier layer located in the bending area;
  wherein the array substrate comprises at least two display areas and at least one bending area, and the bending area is located between two adjacent display areas.

2. The array substrate of claim 1, wherein the thickness of the barrier layer above the bending area is less than a quarter of the thickness of the barrier layer above the display area.

3. The array substrate of claim 1, wherein the thickness of the barrier layer is less than or equal to 120 nm.

4. The array substrate of claim 1, wherein the barrier layer above the bending area comprises a plurality of strip-shaped depressions, and a convex structure is formed between two adjacent strip-shaped depressions; the wiring layer comprises a plurality of signal transmission lines that are disposed at a top of the convex structure, and the strip-shaped depressions are disposed along an extending direction of the signal transmission lines.

5. The array substrate of claim 4, wherein at least one strip-shaped depression of the strip-shaped depressions in the barrier layer above the bending area has a thickness of less than 30 nm.

6. The array substrate of claim 4, wherein each of the strip-shaped depressions extends through the barrier layer to form a through groove, and the strip-shaped depressions are separated from each other.

7. The array substrate of claim 1, wherein the barrier layer above the display area comprises a first barrier layer and a second barrier layer stacked above the first barrier layer from a surface of the flexible substrate; a material of the second barrier layer is different from a material of the first barrier layer.

8. The array substrate of claim 7, wherein the material of the first barrier layer is silicon nitride, and the material of the second barrier layer is silicon oxide.

9. The array substrate of claim 7, wherein a material of the barrier layer above the bending area is the same as that of the first barrier layer.

10. The array substrate of claim 1, wherein the barrier layer above the display area is a three-layer structure of silicon oxide-silicon nitride-silicon oxide.

11. A display panel, comprising the array substrate according to claim 1.

12. The display panel of claim 11, wherein the array substrate comprises the display area and the bending area and the bending area is located outside a short side of the display area.

13. The display panel of claim 12, wherein the bending area is bent to a back surface of the display area.

14. A manufacturing method for an array substrate, comprising:
  providing a flexible substrate having a display area and a bending area;
  laying a barrier layer continuously on the flexible substrate;
  at least partially removing the barrier layer above the bending area in the direction of thickness to make a thickness of the barrier layer above the bending area is less than half of a thickness of the barrier layer above the display area; and
  laying a metal film above the barrier layer located in the bending area, and patterning the metal film to form a wiring layer;

wherein the barrier layer comprises: a first barrier layer and a second barrier layer that are sequentially stacked; wherein a material of the first barrier layer is different from a material of the second barrier layer; and the step of at least partially removing the barrier layer above the bending area in the direction of thickness to make a thickness of the barrier layer above the bending area is less than half of a thickness of the barrier layer above the display area, comprises:

removing the second barrier layer located in the bending area.

15. The manufacturing method for an array substrate of claim 14, wherein the wiring layer comprises a plurality of signal transmission lines;

after the patterning the metal film to form a wiring layer, the method further comprises:

etching the barrier layer between adjacent signal transmission lines in the bending area, so as to remove the barrier layer between adjacent signal transmission lines in the bending area.

16. The manufacturing method for an array substrate of claim 14, wherein the patterning the metal film to form a wiring layer comprises:

etching, using an etching process, the metal film and the first barrier layer that are located in the bending area, to make a pattern that includes a plurality of signal transmission lines is formed in the metal film, and a thickness of the first barrier layer after etching is less than or equal to 30 nm.

\* \* \* \* \*